United States Patent [19]
Kariatsumari et al.

[11] Patent Number: 4,514,699
[45] Date of Patent: Apr. 30, 1985

[54] MICROWAVE POWER AMPLIFIER/COMBINER

[75] Inventors: Keiichiro Kariatsumari, Inagi; Kenji Hirai, Yokohama, both of Japan

[73] Assignee: Tokyo Shibaura Denki Kabushiki Kaisha, Japan

[21] Appl. No.: 451,732

[22] Filed: Dec. 21, 1982

[30] Foreign Application Priority Data

Dec. 22, 1981 [JP] Japan .................................. 56-207311

[51] Int. Cl.$^3$ .............................................. H03F 3/60
[52] U.S. Cl. ...................................... 330/53; 330/286
[58] Field of Search ............................ 330/53, 54, 286

[56] References Cited

U.S. PATENT DOCUMENTS 4,016,503  4/1977  Rambo ................................ 330/53

OTHER PUBLICATIONS

Kunio et al., "Millimeter-Wave Impatt Power Amplifier Combiner," IEEE MTT-24, No. 11, Nov. 1976.

Primary Examiner—James B. Mullins
Assistant Examiner—G. Wan
Attorney, Agent, or Firm—Finnegan, Henderson, Farabow, Garrett & Dunner

[57] ABSTRACT

A microwave power amplifier/combiner which is composed of $\pi/2$ hybrid coupler. This microwave power amplifier/combiner is constructed by associating a $\pi/2$ phase shifter with the $\pi/2$ hybrid coupler to form a 2-amplifier/combiner having a single input/output port and employing the 2-amplifier/combiner as one unit. $2^N$-amplifier/combiner can be constructed by employing a desired number of the unit 2-amplifier/combiner. According to this amplifier/combiner, the microwave power amplifier/combiner which combines the outputs of a large number of power amplifiers can be combined by employing a small number of $\pi/2$ hybrid coupler.

18 Claims, 13 Drawing Figures (PRIOR ART) FIG. 1
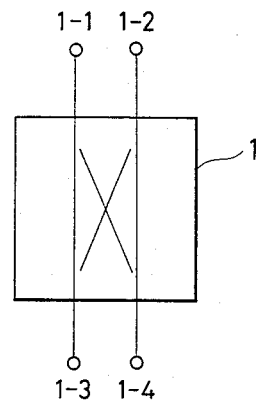
FIG. 2
(PRIOR ART)
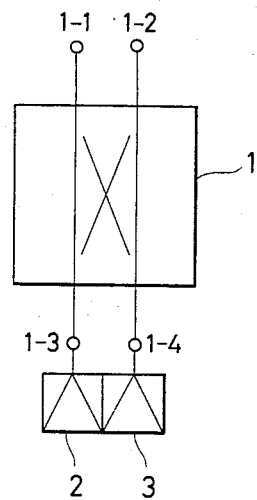

MICROWAVE POWER AMPLIFIER/COMBINER

BACKGROUND OF THE INVENTION

1. Field of the Invention

This invention relates to a microwave power amplifier/combiner for combining the output powers of a plurality of reflection type microwave amplifiers and, more particularly, to an improvement in a microwave power amplifier/combiner which employs a $\pi/2$ hybrid coupler.

2. Description of the Prior Art

A typical conventional power amplifier/combiner for combining the output powers of a plurality of reflection amplifiers has employed a $\pi/2$ phase difference 3-dB hybrid coupler (referred to as HYB). Before the conventional power amplifier/combiner employing the HYB is described, the HYB will first be described.

FIG. 1 shows an example of the HYB, and the function of the HYB 1 is as follows: When an electric power having an amplitude $A_1$ and a phase $P_1$ is supplied from the port 1-1 of the HYB, outputs whose amplitudes and phases respectively $A_2$, $P_2$; $A_3$, $P_3$; and $A_4$, $P_4$ are obtained at ports 1-2, 1-3 and 1-4. When the HYB is ideally constructed, the following relationship can be obtained:

$$A_3 = A_4 = (A_1/2) \tag{1}$$

$$P_4 - P_3 = (\pi/2) \tag{2}$$

When the ports 1-3 and 1-4 are matched, $$A_2 = 0 \tag{3}$$

In this case, the port 1-2 is referred to as an isolation port.

In constructing the HYB, a parallel line type directional coupler, a branch line type coupler, etc. are employed in a plane circuit type, and a side wall coupler, a multihole coupler, etc. are employed in a waveguide type.

FIG. 2 shows a typical conventional amplifier/combiner for combining the output powers of two reflection amplifiers using the HYB shown in FIG. 1. The reflection amplifier referred to here is an amplifier of a type which amplifies the electric power inputted from a port of the amplifier and outputs the output at the same port. In an actual construction, the reflection amplifier employs a microwave semiconductor device such as an IMPATT diode or Gunn diode. If an operating point is appropriately chosen, a negative resistance amplifier or an injection locking amplifier can be constructed.

In FIG. 2, when the electric power $(A_1, P_1)$ is inputted from the port 1-1, output power $(A_3, P_3)$ and $(A_4, P_4)$ is outputted from the respective ports 1-3 and 1-4. It is assumed here that the power gains of the reflection amplifiers 2 and 3 are an equal value G, and an equal phase amount of $P_A$ is shifted.

The electric powers amplified by the amplifiers 2 and 3 are respectively outputted from the ports 1-1 and 1-2. The amplitude and phase of a microwave signal appearing at the port 1-1, which is amplified and reflected by the amplifier 2 and inputted from the port 1-3 into the HYB 1, is represented by $A_{1\text{-}3}$ and $P_{1\text{-}3}$, and the amplitude and phase of the microwave at the port 1-2 is represented by $A_{2\text{-}3}$ and $P_{2\text{-}3}$. Similarly, the amplitudes and phases of the microwave signal appearing at the ports 1-1 and 1-2, which are amplified and reflected by the amplifier 3, and inputted from the port 1-4 into the HYB 1, are respectively represented by $A_{1\text{-}4}$, $P_{1\text{-}4}$, $A_{2\text{-}4}$, $P_{2\text{-}4}$. For the simplicity of description, the phase delays of the transmission line except the coupler port of the HYB are assumed to be equal for 4 branch lines and therefore can be neglected, and the insertion loss caused by the ohmic loss of the HYB is ignored $P_1 = P_3$ and $P_4 = P_1 + \pi/2$ are also assumed.

From the above-described assumption, the following equations can be obtained:

$$A_{1\text{-}3} = A_{1\text{-}4} = A_{2\text{-}3} = A_{2\text{-}4} \tag{4}$$

$$P_{1\text{-}3} = P_3 + P_A \tag{5}$$

$$P_{1\text{-}4} = P_4 + \pi/2 \tag{6}$$

$$P_{2\text{-}3} = P_3 + P_A + \pi/2 \tag{7}$$

$$P_{2\text{-}4} = P_4 + P_A \tag{8}$$

Since the circuit is considered to have no loss, $A_{1\text{-}3} + A_{1\text{-}4} + A_{2\text{-}3} + A_{2\text{-}4} = GA_1$ can be obtained. However, since $P_4 = P_3 + \pi/2$, the equations (6) and (8) can be modified as follows:

$$P_{1\text{-}4} = P_1 + P_A + \pi \tag{9}$$

$$P_{2\text{-}4} = P_3 + P_A + \pi/2 \tag{10}$$

From the equations (5) and (9) the microwaves being equal in amplitude and opposite in phase are produced at the port 1-1, which are cancelled with each other. Further, from the equation (10) the microwaves being equal in amplitude and same in phase are produced at the port 1-2 which are added to one another. In other words, the electric power, respectively amplified and reflected by the amplifiers 2 and 3, is not propagated to the port 1-1, but is outputted as the combined output of $A_{2\text{-}3} + A_{2\text{-}4} = GA_1$ to the port 1-2. In this manner, this circuit functions, although using the reflection amplifiers, as amplifier/combiner of a passing type amplifier having different input and output ports and does not necessitate a circulator which divides into input and output power ports as required in the reflection type amplifier.

FIG. 3 shows a typical conventional 4-amplifier/combiner for combining the outputs of four reflection type amplifiers.

This circuit has four HYBs 4 to 7 and four reflection amplifiers 8 to 11. Loads 12 and 13 are dummy loads. The HYBs 4 to 7 respectively have ports 4-1 to 4-4, 5-1 to 5-4, 6-1 to 6-4 and 7-1 to 7-4. The electric power inputted from the port 4-1 having an amplitude of ½ and a phase difference of /2 is distributed to the ports 4-3 and 4-4.

The output electric powers of the ports 4-3 and 4-4 are, as described with respect to FIG. 2, respectively amplified through two amplifiers/combiners of 2-amplifier/combiner having HYB 5 and amplifiers 8 and 9, and 2-amplifier/combiner having HYB 7 and amplifiers 10 and 11, and are fed to the ports 6-1 and 6-2. Since the microwave thus amplified is maintained with the phase difference $\pi/2$ produced at the HYB 4, it becomes in opposite phase at the port 6-3 and becomes in phase at the port 6-4. In other words, the electric power inputted from the port 4-1 is amplified through the amplifiers 8 to 11, and the combined output is outputted to the port 6-4. Such a 4-amplifier amplifier/combiner is disclosed in IEE Transactions On Microwave Theory And Techniques, Vol. MTT-24, No. 11, November 1976, P.766, FIG. 9(a).

Similarly, a typical conventional 8-amplifier amplifier/combiner is shown in FIG. 4.

In this manner, $2^n$ pieces ($n=1, 2, 3, \ldots$) of amplifiers can be coupled through the HYB, and in the conventional amplifier/combiner, $(3 \times 2^{n-1} - 2)$ pieces of HYBs should be employed to combine the outputs of $2^n$ pieces of amplifiers.

SUMMARY OF THE INVENTION

Accordingly, an object of this invention is to provide a microwave power amplifier/combiner which can perform the same function with a smaller number of HYBs as compared with the conventional amplifier/combiner.

In order to achieve the above and other objects, according to this invention there is provided a microwave power amplifier/combiner which is constructed to comprise a plurality of $\pi/2$ HYBs each having a first port coupled with a dummy load, a second port of an isolation port from the first port to be used as an input/output port, a third port to which a first reflection type amplifier is connected, a fourth port to which a second reflection type amplifier is connected via a $\pi/2$ phase shifter. The input/output signals of the $\pi/2$ HYBs are combined through amplifier/combiner having the $\pi/2$ HYBs and delivered to independent input and output ports.

According to this invention, a microwave power amplifier/combiner with the same performance as a conventional amplifier/combiner can be provided by employing much smaller number of HYBs than the conventional amplifier/combiner having the HYBs, and the entire amplifier/combiner can be reduced in size and weight. For example, in the case of a power amplifier/combiner having $2^n$ pieces of amplifiers, only $(2^n - 1)$ pieces of HYBs may be sufficiently employed. Thus, $(2^n - 1)$ pieces of the HYBs can be reduced as compared with the conventional amplifier/combiner.

An embodiment of the invention will now be described in detail with reference to the attached drawings.

BRIEF DESCRIPTION OF THE DRAWINGS

In the accompanying drawings:

FIG. 1 is a block diagram showing an example of HYB used in this invention;

FIGS. 2, 3 and 4 are circuit diagrams showing an example of a conventional microwave power amplifier/combiner;

DESCRIPTION OF THE PREFERRED EMBODIMENTS

Figure 3:
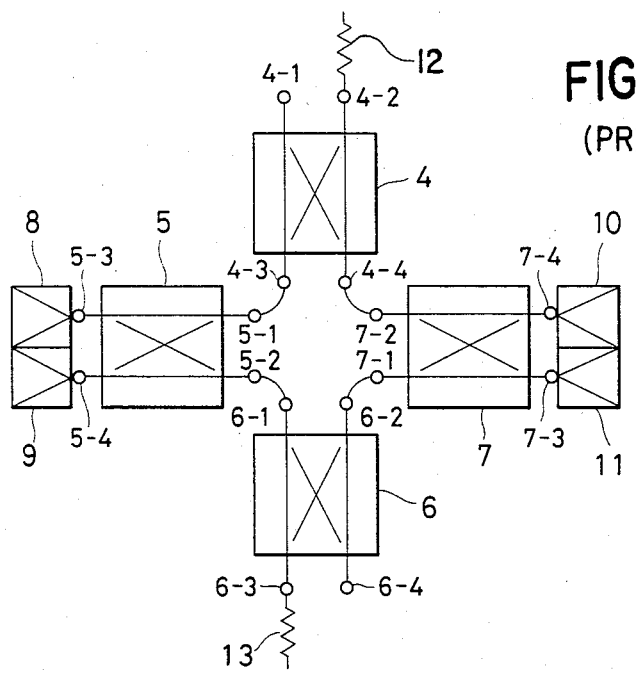
Figure 4:
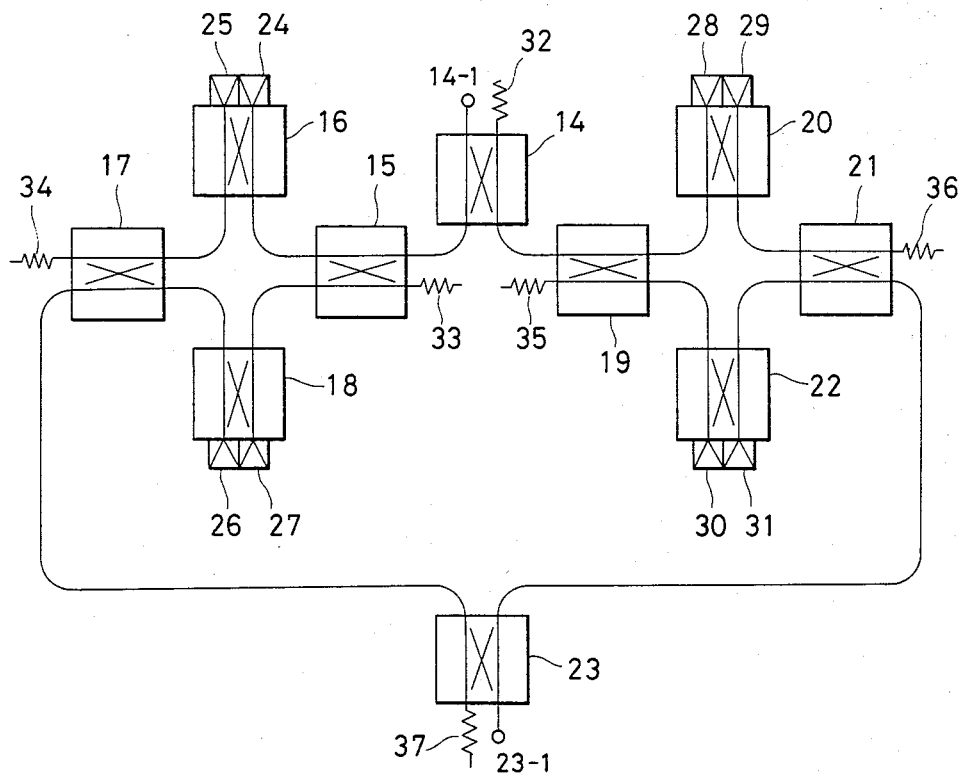
Figure 5:
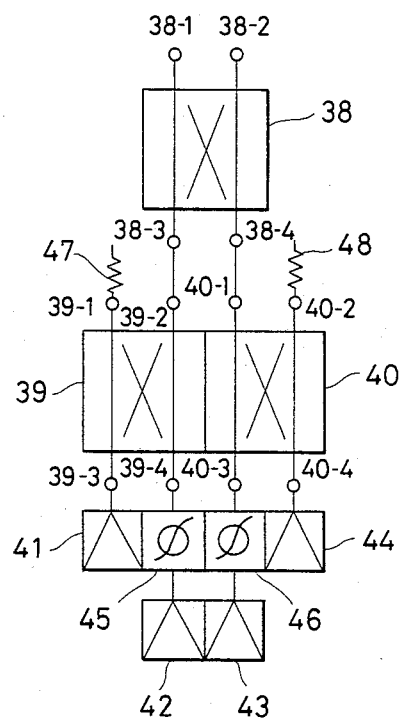
FIG. 5 is a circuit diagram showing an embodiment of a microwave power amplifier/combiner according to the present invention.

Referring to FIG. 5, showing one preferred embodiment of a 4-amplifier amplifier/combiner according to the present invention, the amplifier/combiner has HYBs 38 to 40, $\pi/2$ phase shifters 45 and 46, amplifiers 41 to 44, and dummy loads 47 and 48. The operation of this amplifier/combiner will be described first with respect to 2-amplifier/combiner shown in FIG. 6 which has the HYB 39, the $\pi/2$ phase shifter 45 and the amplifiers 41 and 42.

An electric power inputted from a port 39-2 (having an amplitude $A_2'$ and a phase $P_2'$) is outputted to ports 39-3 and 39-4.

When the amplitudes and the phases of the output powers of the ports 39-3 and 39-4 are respectively represented by $A_3'$, $P_3'$; $A_4'$, $P_4'$, the following relationship can be obtained:

$$A_3' = A_4' = A_2/2' \tag{13}$$

$$P_3' - P_4' = \pi/2 \tag{14}$$

When the amplitudes and the phases of the electric powers amplified by the amplifiers 41 and 41 having equal power gain and phase shifting amounts, appeared at the ports 39-3 and 39-4 are represented by $A_{A3}'$, $P_{A3}'$; $A_{A4}'$, $P_{A4}'$, the following relationship can be obtained:

$$A_{A3}' = A_{A4}' \tag{15}$$

$$P_{A4}' = P_{A4}'\pi/2 \tag{16}$$

The microwave signals amplified and reflected by the amplifiers 41 and 42 are applied at the port 39-1 in the phase of $P_{A3}'$ and $P_{A4}' + \pi/2$, and are applied at the port 39-2 in the phase of $P_{A4}'$ and $P_{A3}' + \pi/2$. Since there is the relationship of the equation (16), two microwaves are combined in the following phases at the port 39-1: $P_{A3}'$ and $P_{A3}' + \pi$, (opposite phase); at the port 39-2: $P_{A3}' + \pi/2$ and $P_{A3}' + \pi/2$, (same phase; Since the two microwaves have equal amplitude, the electric power is not propagated to the port 39-1, and the combined output $(A_{A3}' + A_{A4}')$ is obtained at the port 39-2.

Thus, the reflection type 2-amplifier/combiner having a single input/output port is constructed by inserting the phase shifter 45 between the one port of HYB and the amplifier 42.

Figure 7:
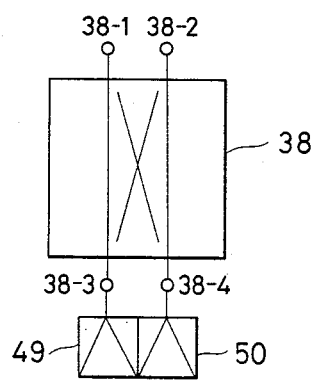

In this manner, the 4-amplifier amplifier/combiner shown in FIG. 5 can be equivalently replaced by an equivalent circuit which is composed of two reflection type 2-amplifier amplifiers/combiners 49 and 50 and HYB 38 as shown in FIG. 7. FIG. 7 shows the circuit arrangement similar to FIG. 2, with the result that the electric power inputted from the port 38-1 is amplified by the four amplifiers and the combined output is obtained from the port 38-2.

The $\pi/2$ phase shifter may be composed of the line, the length of which is $\lambda g/4$, (where $\lambda g$ represents the wavelength in the waveguide), and can be readily incorporated within HYB.

Figure 6:
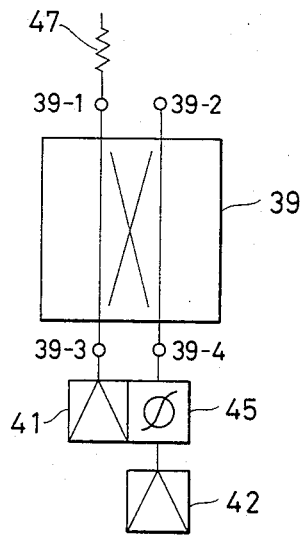
FIGS. 6 and 7 are partial circuit diagram and equivalent circuit for describing the circuit in FIG. 5.
Figure 8:
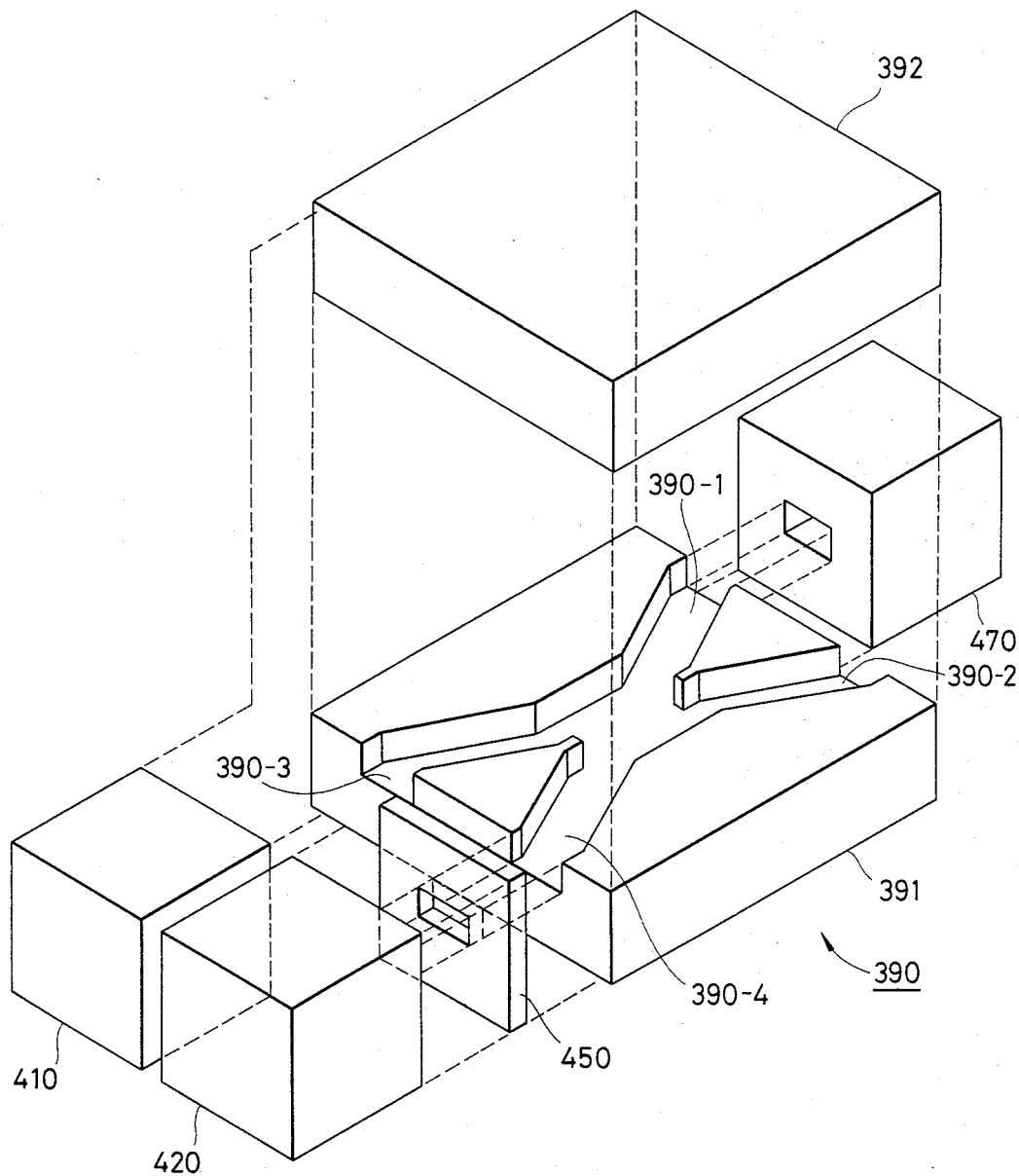
FIG. 8 is a perspective exploded view of a waveguide realizing the circuit in FIG. 6.

FIG. 8 is a perspective exploded view of one embodiment of a waveguide type amplifier/combiner in which the reflection type 2-amplifier/combiner shown in FIG. 6 having a single input/output port by employing a waveguide. In FIG. 8, a groove formed in a metal member 391 forms a waveguide. A metal member 392 is bonded to the member 391, thereby forming an HYB 390, which corresponds to the HYB 39 in FIG. 6. In the HYB 390, ports 390-1 to 390-4 correspond to the ports 39-1 to 39-4 of the HYB 39. Waveguide amplifiers 410 and 420 respectively correspond to the reflection type amplifiers 41 and 42 in FIG. 6, and a metal spacer 450 inserted between the HYB 390 and the amplifier 420 corresponds to the $\pi/2$ phase shifter 45 in FIG. 6. The thickness of the spacer 450 is set to $\frac{1}{4}$ wavelength or $(2n-1)/4$ times, where n represents integer, of the wavelength of the used wave. A load 470 corresponds to the dummy load 47 in FIG. 6. When two 2-amplifier/combiner are associated, and are coupled by employing a known waveguide hybrid coupler, the 4-amplifier amplifier/combiner in FIG. 5 can be composed.

Figure 9:
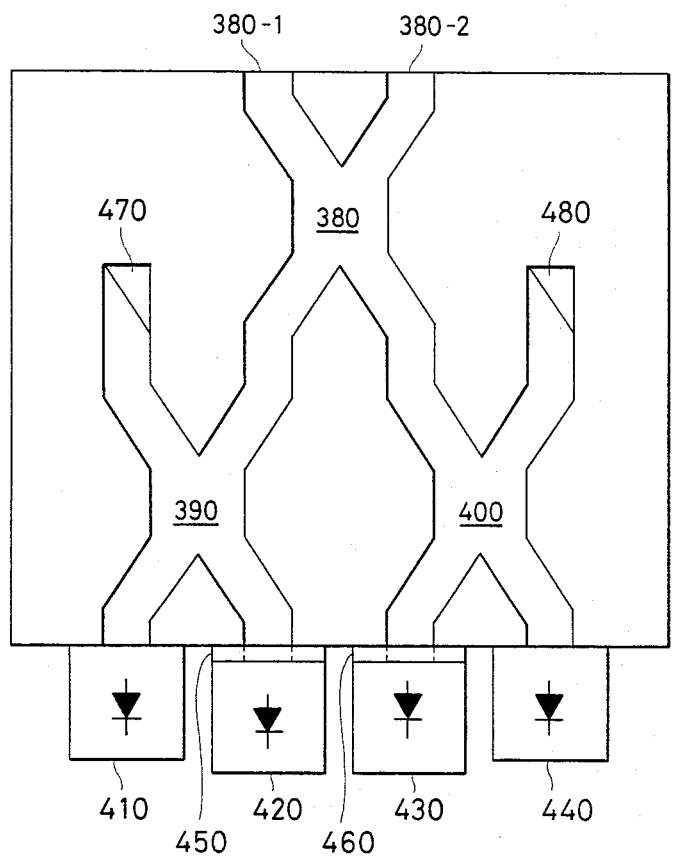
FIG. 9 is a plan view of a part of the circuit employing a waveguide corresponding to the circuit in FIG. 5.

The waveguide type 2-amplifier/combiner and the waveguide hybrid coupler for coupling the amplifier/combiner in FIG. 8 may be separately constructed, and may also be constructed integrally. FIG. 9 is a plan view showing the 4-amplifier amplifier/combiner thus constructed in which the metal member 392 is removed for illustration purpose. This circuit corresponds to the amplifier/combiner in FIG. 5. More specifically, in FIG. 9, amplifiers 410 to 440 respectively corresponds to the reflection amplifiers 41 to 44 in FIG. 5, spacers 450 and 430 respectively correspond to $\pi/2$ phase shifters 45 and 46 in FIG. 5, waveguide couplers 390, 400 and 380 respectively correspond to the HYB 39, 40 and 38, and ports 380-1 and 380-2 respectively correspond to the ports 38-1 and 38-2 in FIG. 5. In FIG. 9, tapered fillers 470 and 480 respectively correspond to dummy loads 47 and 48 in FIG. 5. Carbon may be used for forming the fillers.

Figure 10:
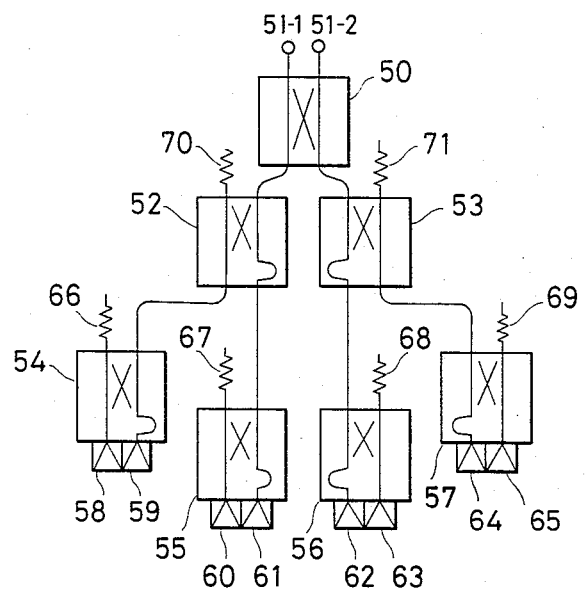
FIG. 10 is a circuit diagram showing another embodiment of the present invention constructing 8-amplifier amplifier/combiner.

The 4-amplifier amplifier/combiner has been described as above. Further, 8-amplifier amplifier/combiner may be similarly constructed. This is shown in FIG. 10. In FIG. 10, HYB 52 to 57 are composed by employing $\pi/2$ phase shifter-containing HYB in which a $\pi/2$ phase shifter is built in.

Figure 11:
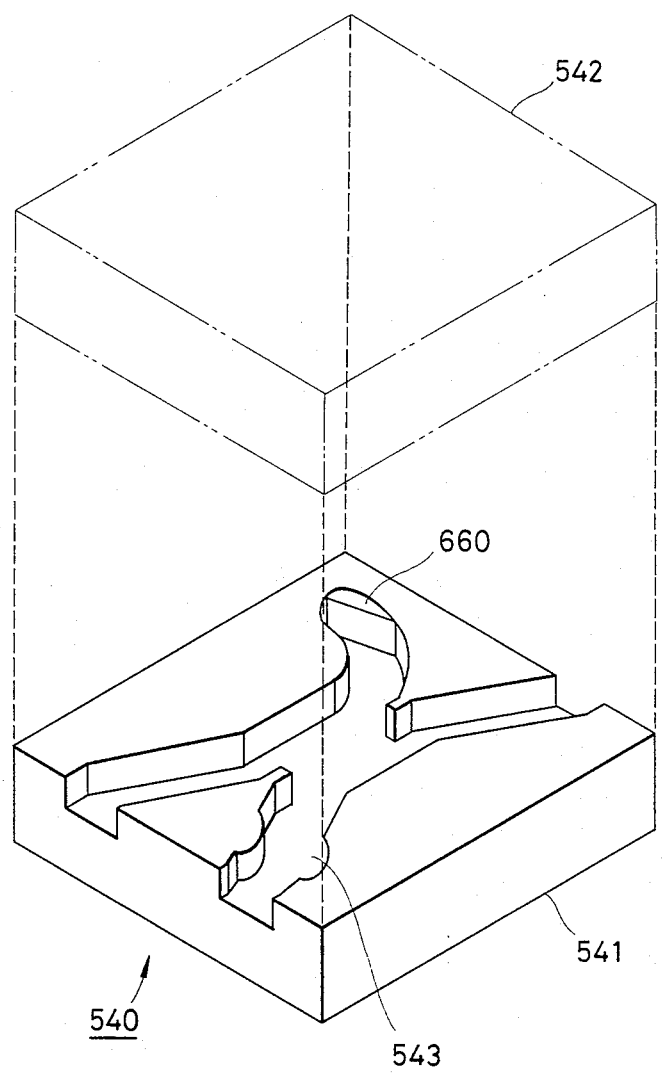
FIG. 11 is a perspective exploded view of a circuit employing a waveguide realizing the circuit incorporating the HYB and a phase shifter used in FIG. 10.
Figure 12:
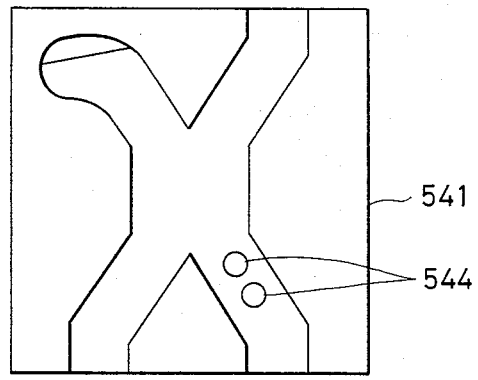
FIGS. 12 and 13 are plan views of a part of still another embodiments of the circuit shown in FIG. 1.
Figure 13:
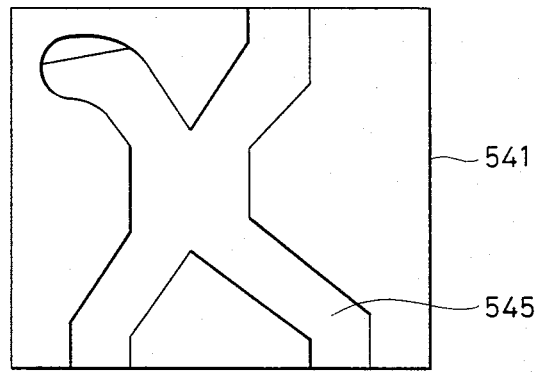

FIG. 11 shows such $\pi/2$ phase shifter-containing HYB composed in a form of a waveguide, in which a metal member 541 formed with a groove of predetermined shape is bonded with a metal member 542 to form a $\pi/2$ phase shifter-containing HYB. In this circuit, a bent part 543 formed in one branched groove of the member 541 forms $\pi/2$ phase shifter. The bent part 543 is formed for the purpose of extending the substantial length of the branched groove by $(2n-1)/4$ (where n is an integer) the wavelength of a signal to be applied. This HYB contains a dummy load, which is formed by a filler 660 provided at one end of the groove. In forming the $\pi/2$ phase shifter in the HYB, other method may be used instead of forming the bent part in FIG. 11. FIG. 12 shows another method in which a $\pi/2$ phase shifter is formed by inserting a dielectric post 544 into one of the branched grooves. The dielectric post 544 may be one, but may actually be preferably a plurality. In FIG. 13, a $\pi/2$ phase shifter is formed by increasing the length of one groove by changing the branch angle of the groove with other grooves.

In the embodiment described above, the HYB whose power distribution rate is $\frac{1}{2}$ has been described. However, the distribution rate may not be limited to $\frac{1}{2}$. In the case where the distribution rate is other than $\frac{1}{2}$, when the power gain of the amplifier connected to the distribution circuit is set so that the amplitude becomes equal in the isolation port, the combined output of the amplifier can be obtained from another one port. The frequency band normally using an IMPATT diode or Gunn diode is a frequency higher than semi-millimeter frequency band, and it is preferred to employ a waveguide at the viewpoint of the heat dissipation and the circuit loss of the diode.

What is claimed is:

1. A microwave power amplifier/combiner comprising:

a plurality of reflection type 2-amplifier combiner means each including a $\pi/2$ hybrid coupler, a $\pi/2$ phase shifter, first and second reflection amplifiers and a dummy load, said $\pi/2$ hybrid coupler having a first port to which said dummy load is connnection, a second port which is isolated from said first port and is used as an input/output port, a third port to which said first reflection amplifier is connected, and a fourth port to which said second reflection amplifier is connected via said $\pi/2$ phase shifter; and combining means for combining the outputs of at least two of said plurality of reflection type 2-amplifier combiner means having an input port and an output port, both ports being isolated from each other, and said means for combining being connected to said respective input/output ports of said at least two reflection type 2-amplifier/combiner means.

2. A microwave power amplifier/combiner as claimed in claim 1, wherein said plurality of reflection type 2-amplifier/combiner means includes two reflection type 2-amplifier/combiners, and said combining means consists of a $\pi/2$ hybrid coupler having a first port used as an input port, a second port which is isolated from said first port and is used as an output port, a third port to which the input/output port of one of said two reflection type 2-amplifier/combiners is connected, and a fourth port to which the input/output port of the other one of said two reflection type 2-amplifier/combiners is connected.

3. A microwave power amplifier/combiner as claimed in claim 1, wherein said plurality of reflection type 2-amplifier/combiner means are $2^N$ reflection type 2-amplifier/combiners, where N represents an integer, said combining means comprises $2^{N-1}$ first $\pi/2$ hybrid couplers each having a first port to which a dummy load is connected, a second port which is isolated from said first port and is used as an input/output port, a third port to which the input/output port of another one of said plurality of 2-amplifier/combiner means is connected, and a fourth port to which the input/output port of yet another one of said plurality of 2-amplifier/combiner means is connected via a $\pi/2$ phase shifter; and a second $\pi/2$ hybrid coupler having a first port used as an input port, a second port which is isolated from said first port and is used as an output port, a third port to which the input/output port of one of said first $\pi/2$ hybrid coupler is connected, and a fourth port to which the input/output port of the other one of said first $\pi/2$ hybrid coupler is connected.

4. A microwave power amplifier/combiner as claimed in claim 1, wherein said plurality of reflection type 2-amplifier/combiner means are $2^N$ 2-amplifier/combiners, where N represents an integer, and said combining means consists of $2^{N-1}$ first circuits each including a $\pi/2$ hybrid coupler having a first port to which a dummy load is connected, a second port which is isolated from said first port and is used as an input/output port, a third port to which the input/output port of one of said reflection type 2-amplifier/combiner means is connected, and a fourth port to which the input/output port of the other one of said reflection type 2-amplifier/combiner means is connected via a $\pi/2$ phase shifter.

5. A microwave power amplifier/combiner as claimed in claim 4, wherein said $2^{N-1}$ first circuits are two first circuits, and said combining means comprise a $\pi/2$ hybrid coupler having a first port used as an input port, a second port which is isolated from said first port and is used as an output port, a third port to which the input/output port of one of said two first circuits is connected, and a fourth port to which the input/output port of the other one of said two first circuits is connected.

6. A microwave power amplifier/combiner as claimed in claim 4, wherein said $2^{N-1}$ first circuits are first circuits, where n represents an integer, said combining means includes $2^{n-1}$ second circuits each including a $\pi/2$ hybrid coupler having a first port to which a dummy load is connected, a second port which is isolated from said first port and used as an input/output port of one of said first circuits is connected, a third port to which the input/output port of one of said first circuit is connected, and a fourth port to which the input/output port of the other one of said first circuits is connected through a $\pi/2$ phase shifter.

7. A microwave power amplifier/combiner as claimed in claim 6, wherein said $2^{n-1}$ second circuits are two second circuits, said combining means includes a $\pi/2$ hybrid coupler having a first port used as an input port, a second port used as an output port, a third port to which the input/output port of one of said two of second circuits is connected, and a fourth port to which the input/output port of the other one of said two of second circuits is connected.

8. A microwave power amplifier/combiner as claimed in any of claims 1 to 7, wherein said $\pi/2$ hybrid coupler is a waveguide.

9. A microwave power amplifier/combiner as claimed in any of 1, 4, 5, and 3, wherein said $\pi/2$ phase shifter is formed of a spacer of a width of ¼ of the wavelength of an input microwave signal between said fourth port of said $\pi/2$ hybrid coupler and said second reflection amplifier.

10. A microwave power amplifier/combiner as claimed in any of claims 1, 3, 5, and 7 wherein said $\pi/2$ hybrid coupler and said $\pi/2$ phase shifter are formed integrally.

11. A microwave power amplifier/combiner as claimed in any of claims 1, 4, 6, and 3, wherein said $\pi/2$ hybrid coupler, said $\pi/2$ phase shifter and a dummy load are integrally formed.

12. A microwave power amplifier/combiner as claimed in claim 1, wherein said plurality of reflection type 2-amplifier/combiner means and said combining means are integrally formed.

13. A microwave power amplifier/combiner as claimed in claim 12, wherein said $\pi/2$ phase shifter is formed by increasing the apparent electrical length of the line relative to the fourth port of said $\pi/2$ hybrid coupler by $(2n-1)/4$, where n is an integer, of the wavelength of an input microwave signal compared with the apparent electrical length of the line relative to the third port.

14. A microwave power amplifier/combiner as claimed in claim 13, wherein said $\pi/2$ phase shifter comprises a bent part of a conducting line between the fourth port of said $\pi/2$ hybrid coupler and the $\pi/2$ phase shifter.

15. A microwave power amplifier/combiner as claimed in claim 12, wherein said $\pi/2$ phase shifter includes a dielectric member of predetermined shape inserted between the fourth port of said $\pi/2$ hybrid coupler and the $\pi/2$ phase shifter.

16. A microwave power amplifier/combiner as claimed in claim 15, wherein said dielectric member of predetermined shape is one or more dielectric posts.

17. A microwave power amplifier/combiner as claimed in claim 12, wherein said dummy load includes a microwave absorbing material of predetermined shape inserted adjacent to the second port of said $\pi/2$ hybrid coupler.

18. A microwave power amplifier/combiner as claimed in claim 17, wherein said microwave absorbing material of predetermined shape is a carbon member having a tapered part.

* * * * *

UNITED STATES PATENT AND TRADEMARK OFFICE
CERTIFICATE OF CORRECTION

PATENT NO. : 4,514,699
DATED : April 30, 1985
INVENTOR(S) : Keiichiro Kariatsumari et al.

It is certified that error appears in the above—identified patent and that said Letters Patent is hereby corrected as shown below:

Claim 6, line 3, before "first" insert -- $2^n$ --.

Signed and Sealed this

Twenty-second Day of October 1985

[SEAL]

Attest:

Attesting Officer

DONALD J. QUIGG

Commissioner of Patents and Trademarks—Designate